(12) United States Patent
Oetting

(10) Patent No.: US 8,409,455 B1
(45) Date of Patent: Apr. 2, 2013

(54) METHODS AND DEVICES FOR ULTRA SMOOTH SUBSTRATE FOR USE IN THIN FILM SOLAR CELL MANUFACTURING

(75) Inventor: Wolf Oetting, San Jose, CA (US)

(73) Assignee: Nanosolar, Inc., San Jose, CA (US)

( * ) Notice: Subject to any disclaimer, the term of this patent is extended or adjusted under 35 U.S.C. 154(b) by 177 days.

(21) Appl. No.: 12/826,647

(22) Filed: Jun. 29, 2010

Related U.S. Application Data

(60) Provisional application No. 61/221,517, filed on Jun. 29, 2009.

(51) Int. Cl.
*B44C 1/22* (2006.01)

(52) U.S. Cl. ............. 216/38; 216/52; 216/102; 216/103
(58) Field of Classification Search .................. 216/38, 216/52, 102, 103
See application file for complete search history.

(56) References Cited

U.S. PATENT DOCUMENTS 2,079,516 A * 5/1937 Lilienfeld ..................... 361/529

* cited by examiner

*Primary Examiner* — Roberts Culbert
(74) *Attorney, Agent, or Firm* — Joshua D. Isenberg; JDI Patent

(57) ABSTRACT

Methods and devices for high-throughput manufacturing of a solar cell with a diode is provided.

10 Claims, 2 Drawing Sheets

METHODS AND DEVICES FOR ULTRA SMOOTH SUBSTRATE FOR USE IN THIN FILM SOLAR CELL MANUFACTURING

CROSS-REFERENCE TO RELATED APPLICATION

This application claims the benefit of priority of U.S. Provisional Patent Application Ser. No. 61/221,517 filed Jun. 29, 2009 and fully incorporated herein by reference for all purposes.

FIELD OF THE INVENTION

This invention relates to substrates and more specifically to fabrication of solar cells on metal foil substrates.

BACKGROUND OF THE INVENTION

There is a need in the art for an efficient effective method of preparing rough substrates for use in solar cell manufacturing.

SUMMARY OF THE INVENTION

The disadvantages associated with the prior art are overcome by embodiments of the present invention. One of the main cost drivers is making it smooth with mirror finish requires different, expensive rolling process that also limits the number of materials which can be processed to such finish. Embodiments of the present invention address this issue.

In one embodiment of the present invention, instead of using super quality smooth substrate, it is possible to use very poor quality conductive substrate. The poor quality is a based on the surface roughness which may be chemically brightened, and subsequently smoothed by reflow of material into the valleys. It is possible to plate Mo on top of the reflowed material.

This process could allow the use of high strength Al foil since the process does not use mechanical rolling to achieve the high smooth finish. Mechanical rolling is limited in the alloy or material that can be used due to the smoothening processes. A substrate left in a condition that is too rough would short the cell that is formed on this substrate.

Chemical brightening also has limitations as to how smooth it can make the substrate. Some peaks typically remain and there are typically some impurities which can accumulate in some areas which prevent full smoothening.

Some embodiments may use a plating additive or grain refiner that creates such a small grain structure that improves filling of the valleys in the rough surface of the substrate material. If the material is too large, the filler will create a mirror of the undesired roughness without smoothing the surface.

Optionally, some embodiments may place a chromium layer on top of nickel filler. Optionally some embodiments remove native oxide from the substrate. Optionally, some leave native oxide if not it does not present adhesion issues. Optionally, some embodiments may remove native oxide off, plate the metal substrate with nickel, and silver on top.

In one embodiment of the present invention, a substrate smoothening method is provided comprising providing a metal substrate with a front surface having substantially flat surface portions and protruded surface portions; rough finishing the metal substrate to have an Ra in the range of about 0.2 to about 0.5 microns; removing the some of the protruded surface portions by etching the some of the protruded surface portions to form exposed substrate sections of the metal substrate, wherein the metal substrate has a hardness that prevents smoothening to a desired finish; flowing a second material into depressed surface portions of the substrate and to build up a new top surface having a roughness of about 0.05 microns or smoother; and depositing a contact layer on the second material. In one embodiment, the substrate has a hardness such that mill finishing cannot achieve greater than about 0.2 to about 0.5 microns Ra. In one embodiment, the substrate has a hardness such that mill finishing cannot achieve greater than about 0.5 to 1.0 microns Ra. The desired smoothness can be achieved without having to resort to vacuum deposition processes or high pressure rollers. The deposition allows for filling that does not delaminate and creates a multi-metal foil that in some embodiments, can have higher electrical conductivity than the original foil. The backside of the foil, can remain rough, or can be insulated with an oxide such as alumina to prevent electrical contact issues or chemical reactivity issues on the back side. One embodiment creates a substrate with a surface layer of a second material creating a connective network or layer linking all valleys in the substrate together, wherein the connective network or layer may be the same as or different from the valley filling material.

For any of the embodiments herein, the contact layer may be one of tungsten, tantalum, molybdenum, titanium, chromium, ruthenium, iridium and osmium. Optionally, the method includes forming a Group IBIIIAVIA absorber layer over the contact layer. Optionally, the method includes forming the Group IBIIIAVIA absorber layer by forming a precursor layer by depositing the precursor layer comprising copper, indium and gallium; and reacting the precursor layer in presence of at least one of selenium and sulfur at a temperature range of 400 to 600.degree. C. Optionally, the method includes forming a transparent layer over the Group IBIIIAVIA absorber layer, and forming a terminal including busbars and conductive fingers over the transparent layer, wherein the transparent layer includes a buffer layer including one of cadmium sulfide and indium sulfide deposited over the Group IBIIIAVIA layer and a transparent conductive layer including one of zinc oxide, indium tin oxide, and indium zinc oxide deposited over the buffer layer Optionally, the method includes using a conductive protective film that comprises one of ruthenium, osmium and iridium. Optionally, the method includes forming a protective film on the substrate comprises sputter depositing ruthenium. Optionally, the method includes selective etching to planarize the some of the protruded surface portions. Optionally, the method includes selective etching performed using an etchant comprising hydrochloric acid. Optionally, the method includes having surfaces of the exposed substrate sections and a top surface of the conductive protective film are substantially coplanar.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for a barrier film, this means that the barrier film feature may or may not be present, and, thus, the description includes both structures wherein a device possesses the barrier film feature and structures wherein the barrier film feature is not present.

In one embodiment, the present invention provides for ultra smooth, functional and conductive metal substrate for thin film CIGS solar cells. Of course, other thin-film absorbers such as but not limited to CdTe, CIGSS, or CZTS are not excluded.

Figure 4:
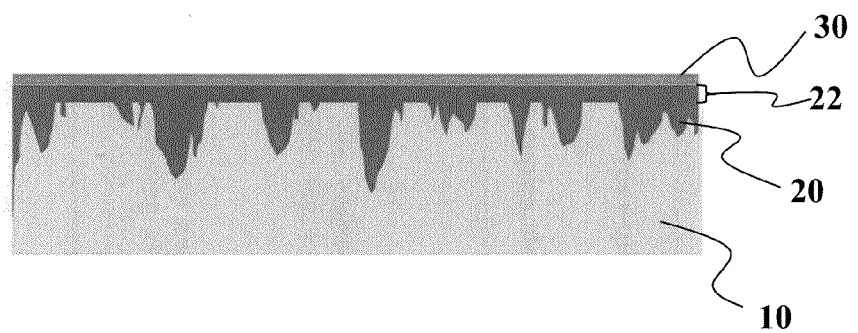

Instead of using a cold rolling process for smooth finish of metal foil substrate, embodiments of the present invention uses standard mill finish and electroplate or otherwise fill with "filler metal(s)" capable of filling the valleys of the rough surface of the metal substrate. In one embodiment, filler metal or material is designed to also have diffusion barrier properties against Al diffusion in high temperature processes and/or corrosion protection functions. An intermediate etching step is optional and would keep cost lower for usage of more expensive filler metals (e.g. Ni, Cr, Cu, or other metal fillers). In some embodiments, filler materials include, but are not limited to tungsten (W), tantalum (Ta), molybdenum (Mo), titanium (Ti), chromium (Cr), ruthenium (Ru) and iridium (Ir), osmium (Os) their alloys and/or nitrides. In some embodiments, an oxide and/or bulk property of the second material is electrically conductive so that this filler increases the electrical conductivity at the interface of the top surface of the substrate. Thus, it simultaneously fills and increases the electrical conductivity of the resulting substrate. As seen in FIG. 4, the filler in one embodiments is fully connecting all of the valleys. Optionally, the filler material does not fully fill or overflow the valley in manner that connects them together. Some embodiments may use a patterned fill that connects valleys by grid lines of material over the valley areas. Addition of grain refiners in plating process will also improve filling capabilities.

One goal would be add a thin plated (electro or electroless) Mo layer as conductive layer for CIGS or thin film formation instead of a vacuum based Mo deposition process.

This would allow for manufacture Al based substrate for thin-film absorber in one single integrated process without using expensive smoothing technologies or PVD coatings. In one embodiment, this may include combination of different plating technologies in a high throughput process with small material usage, but maximum material utilization. One embodiment would substrate all PVD coated barrier layers with layers formed by non-vacuum deposition processes. Of course, other metal substrates are not excluded from being processed using these methods.

Figure 1:
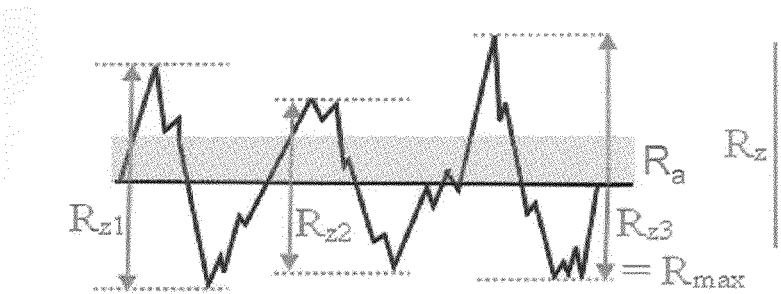
FIGS. 1-4 show cross-sectional views according to embodiments of the present invention.

Referring now to FIG. 1, one embodiment of the present invention will now be described. FIG. 1 shows that metal substrate 10 with very rough surface finish may be processed for use in solar cell manufacturing. Mill finished metal substrate such as but not limited to aluminum metal substrate may have an Ra in the range of about 0.2 to about 0.5 microns. In this example, Rz may be in the range of about 3 to about 7 microns. In one embodiment, the target smoothness for this embodiment is about 0.05 microns or smoother (i.e. less than 0.05 microns). Thus, as seen, the starting material is one or more orders of magnitude rougher than the desired finish. By way of nonlimiting example, the metal foil may be steel, carbon steel, stainless steel, aluminum, molybdenum, or single or multiple combinations of the foregoing. Some embodiments may be of one metal on an upper surface and a different material (metal, polymer, polyimide, or the like) in the interior and/or underside.

Figure 2:
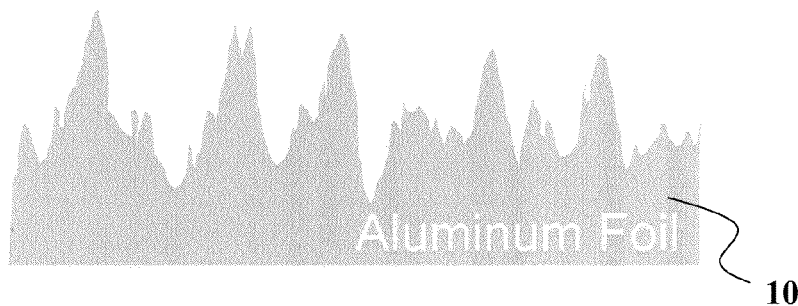

Referring to FIG. 2, it is seen that the mill finish of the metal substrate 10 is significantly rougher than desired. This roughness allows for reduced cost in the material. It also allows for use of alloys or metal that cannot be mechanically or chemically smoothened. This enables the use of stiffer materials in the substrate that would otherwise not be suitable due to inability to create the desired surface smoothness.

Figure 3:
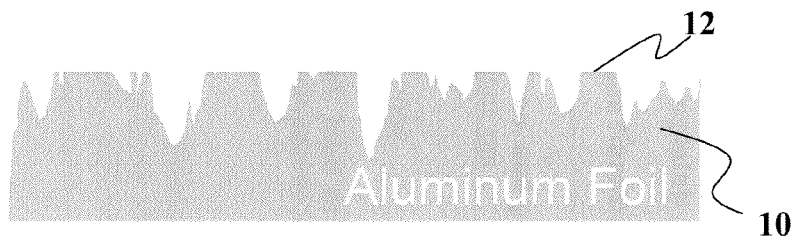

Referring to FIG. 3, one optional step to the processing of the rough starting foil may include peak removal using methods such as but not limited to chemical brightening to remove peak heights by etching. Peak removal creates area of increased flatness 12, but does not remove all of the valleys in the substrate. Optionally, some material removal techniques include but are not limited to chemical mechanical polishing, mechanical polishing and buffing techniques, and wet or dry material removal techniques and the like.

Referring now to embodiment of FIG. 4, the reflow plating 20 may fill valleys in the substrate 10 with one to five microns of metal material such as but not limited to copper, chromium, nickel, or the like to create the desired ultra smooth surface. Plating may occur by electro or electroless plating or other plating techniques. One embodiment creates a substrate with a surface layer of a second material creating a connective network or layer 22 linking all valleys in the substrate together, wherein the connective network or layer may the same as or different from the valley filling material. In one embodiment, the layer 22 has a thickness in the range of about 10 to 500 nm. It has a sheet resistance of less than about 10 ohm/sq, optionally, less than 5 ohm/sq. Optionally, the plating 20 regulates electrical transport at the interface between the depression and substrate. Optionally, the plating 20 regulates electrical transport at the interface between the top layer of this filler material and any overlying layer. It is desirable that this is a layer where the oxide of the second material is more electrically conductive than an oxide of the substrate 10 to ensure good electrical connection. The reflow plating 20 creates a fill region that fills the valleys, and an interface region on the top side having the desired Ra.

Anode chamber includes an anolyte solution associated with the anode. Cathode chamber forms, in this embodiment, the major chamber of electroplating compartment 203. It contains a "plating bath" associated with a cathode. Thus, the plating bath serves as a catholyte. During electroplating, an electrical field is established between anode and cathode. This electrical field drives positive ions from anode chamber through barrier and cathode chamber and onto cathode. At cathode, an electrochemical reaction takes place in which positive metal ions are reduced to form a solid layer of metal on the surface of cathode. In a preferred embodiment, the metal ions are copper ions and copper metal is deposited into the trenches on a semiconductor wafer, bottom-up. In many designs, the cathode/substrate rotates during electroplating.

Anode may be made from either a sacrificial metal such as copper or a dimensionally stable metal such as titanium or platinum. An anodic potential is applied to anode via an anode electrical connection. Typically this connection includes a lead formed from a corrosion resistant metal such as titanium or tantalum. Cathodic potentials are provided to cathode via a lead, which may also be made from a suitable metal.

As indicated above, a primary purpose of porous membrane is to maintain a separate chemical and/or physical environment in anode chamber and cathode chamber. Most importantly, membrane should be designed or selected to largely prevent non-ionic organic species from entering anode chamber. More specifically, poison forming organic additives should be kept out of anode chamber. Further details of porous membrane will be provided below.

The catholyte may be circulated between cathode chamber and a catholyte reservoir. The temperature and composition of the catholyte may be controlled within catholyte reservoir. For example, one can monitor and control the level of non-ionic plating additives within reservoir. Gravity can enable the return of excess catholyte out of cathode chamber and into catholyte reservoir. Treated catholyte from reservoir may then be directed back into cathode chamber by a pump via a line.

Catholyte, Anolyte, and Anode

Generally, the catholyte should promote good bottom-up electroplating on a metal substrate. It should have good ionic conductivity, adequate metal ion concentration to ensure that metal deposition will not be concentration limited, and additives to promote bottom-up plating. The catholyte should be optimized for film quality, uniformity of deposition, and fill performance.

The components of a suitable catholyte generally include copper (or other deposition metal) ions, a supporting electrolyte such as acid (if necessary to improve conductivity), and "plating additives." Examples of plating additives include accelerators, suppressors, and levelers:

Suppressors generally provide a large change in the kinetic overpotential of the deposition reaction. This tends to give a more uniform current distribution over the surface of the wafer and thereby allows the copper deposition to proceed with a global leveling. The suppressors absorb strongly to copper and are not substantially consumed during the deposition reaction. Suppressors should be distinguished from levelers, which also increase the surface overpotential but which are consumed or altered during the deposition reaction. Typically suppressors are high molecular weight oxygen containing polymers such as polyethylene oxide, polypropylene oxide, co-polymers (random and block) of the monomers of the preceding polymers, and other strong surfactant molecules. Preferably, polymeric suppressors that may be used with this invention have a molecular weight of between about 1000 and 10,000 with concentrations of about 100-1000 parts per million by weight.

Accelerators (also referred to as catalysts or brighteners) are also strongly surface adsorbing and they compete with the suppressor molecules for surface sites on the deposited copper. The accelerators can alter the suppression process and tend to relatively accelerate the local plating process on the active surface of the copper seed layer. Often, accelerators are sulfur containing, low molecular weight compounds such as mercaptopropane sulfonic acid (MPS), N-N-methyl dithiocarbonic acid (DPS), and dimercaptopropane sulfonic acid (SPS). Preferably a combination of accelerators and suppressors is used to obtain void free filling of high aspect ratio vias and trenches. Preferably, the accelerators that may be used with this invention are present in a concentrations of between about 0.5 and 25 parts per million by weight. Examples of other "additives" include surface agent such as wetting agent. Examples of wetting agents include sodium lauryl sulfate (e.g., between about 0-2% by weight), and various co-polymers of ethylene oxide (EO) and proplyene oxide (PEO).

In the context of copper electroplating catholytes, examples of suitable copper salts include copper sulfate, copper phosphate, copper pyrophosphate, copper perchlorate and copper salts of any other stable anion over the potential likely to be found in the copper plating operation. These are preferably present in the catholyte at a concentration of between about 10 and 50 grams of copper ion per liter of electrolyte, more preferably between about 18 and 40 grams of copper ion per liter. Typically, higher copper concentrations are used in combination with lower acid concentrations. Examples of supporting electrolyte include sulfuric acid, phosphoric acid, hydrochloric acid, and the like. A typical sulfuric acid supporting electrolyte is preferably present in the catholyte at a concentration of between about 0 and 250 gm/l weight percent, more preferably between about 10 and 180 weight percent.

Various commercially available copper plating baths are suitable for many embodiments of this invention. Examples of commercial copper plating solutions suitable for use with this invention include Ultrafill™ available from Shipley Ronal of Marlboro, Mass. and CuBath™ and Viaform™ available from Enthone OMI of New Haven, Conn. Both of these solutions contain non-ionic organic additives that facilitate bottom-up plating.

The anolyte contained in the anode chamber generally will have a composition similar to that of the catholyte but will be substantially free of non-ionic plating additives. Thus, the anolyte may be any desirable electrolyte solution, but preferably not containing any plating bath additives. When practical, it is also generally preferable that the anolyte contain a substantially lower acid concentration than the catholyte. To the extent that organic additives are present in the anolyte, the apparatus and methods of this invention should maintain them at concentrations below about 10% of that in the catholyte.

The anode is typically composed of pure copper and is substantially free of oxygen. In a preferred embodiment it contains from 0 to 1% atomic phosphorous, more preferably from 0.02 to 0.04% atomic phosphorous. Suitable materials can be obtained from Materials Research Corporation of Orangeburg, N.Y. This invention can also employ a dimensionally stable anode. Sometimes, however, a dimensionally stable electrode is not preferred for plating very small copper Damascene features. The rate of oxidation of plating bath additives is much greater in non-consumable configurations. This is because 1) there is no protective film on the anode to reduce the rate of oxidation and 2) the potential at the non-consumable anode is very high (substantially higher than the oxygen formation potential), leading to a high rate of degradation. In contract, the potential at the copper anode is less than 100-200 mV anodic of the copper equilibrium potential (much less oxidizing).

Optionally, instead of reflowing copper, some embodiments may reflow nickel into the valley to smoothen the foil. In one nonlimiting example of nickel plating, the substrate may be immersed for 20 minutes in an electroless nickel plating solution at pH 4.5 containing nickel chloride ($2.3 \times 10^{-1}$ mol/L), sodium hypophosphite ($2.8 \times 10^{-1}$ mol/L), and sodium citrate (1.6.times.10.sup.-1 mol/L) to form a nickel plating layer 15 in the opening part with the thickness of 5 microns.

Referring still to the embodiment of FIG. 4, a plated Mo layer 30 of about 0.1 to about 0.3 microns without further diffusion barrier could be integrated into the process. Of course, the Mo may also be plated on other substrates, such as those milled to the desired smoothness and is not limited to only those embodiments with the reflowed surface smoothness.

In one embodiment, molybdenum may be efficiently-electrodeposited from aqueous electrolytes containing molybdic acid, its anhydride or its salts in the presence of aliphatic acids and high concentrations of salts of aliphatic acids. Among the additional salts which may advantageously be used in the process are the sodium, potassium or ammonium formate, acetate, and propionate or .combinations of the same. It is of advantage to employ such concentrations of these salts that the mol ratio of added anion to water is from 1 to 2 up to 1 to 4, preferably between 1 to 2.2 and 1 to 3.

The work on which the electrodeposition of molybdenum is desired is placed in the electrolyte to form the cathode and the anode is a conducting material which will not.be attacked by the reaction products at the anode, such as platinum or carbon. A cathode of copper, iron, or nickel has been found to be satisfactory.

The electrolytic bath is optionally maintained slightly acid, the optimum conditions being a pH between 5.5 to 6.8 as measured with a glass electrode. Under some conditions however the pH may be varied from this range and, in particular, a potassium-ammonium propionate bath will give good deposits at a pH of 7.4.

The current density may be varied quite widely but the optimum .conditions, are between 0.1 to 0.8 ampere per square centimeter of cathode surface. The temperature of the bath is. preferably .maintained between, 30° C. and 50° C. A variety of electrolyte compositions may be used for Mo deposition. The following are examples are some and are nonlimiting as other formulations may also be suitable.

Example I

An electrolyte is made up of the following composition:
5 g. molybdic anhydride
60 g. KOH
55 cc, NH4OH (28% NHs)
30 75CC.HC62H (87%) 15 cc.H2O Example 2

5 g. molybdie anhydride
50 g; KC2H3O2
10 . . . (glacial)
65-cc.:H2O

Example 3

5 g. molybdic anhydride
74 cc. protrfonic acid. (HCsHsOz)
32 gm. (NH4>2COs
19 gm. KOH
28 cc. H2O Example 4

5 g mnlvhdic anhydride
60 g. KOH
55 cc. NH4OH (28% NHs)
75 cc. HCOsH (87%)
15 cc. HsO
30 cc. FeSOi (0.1M)

Figure 5:
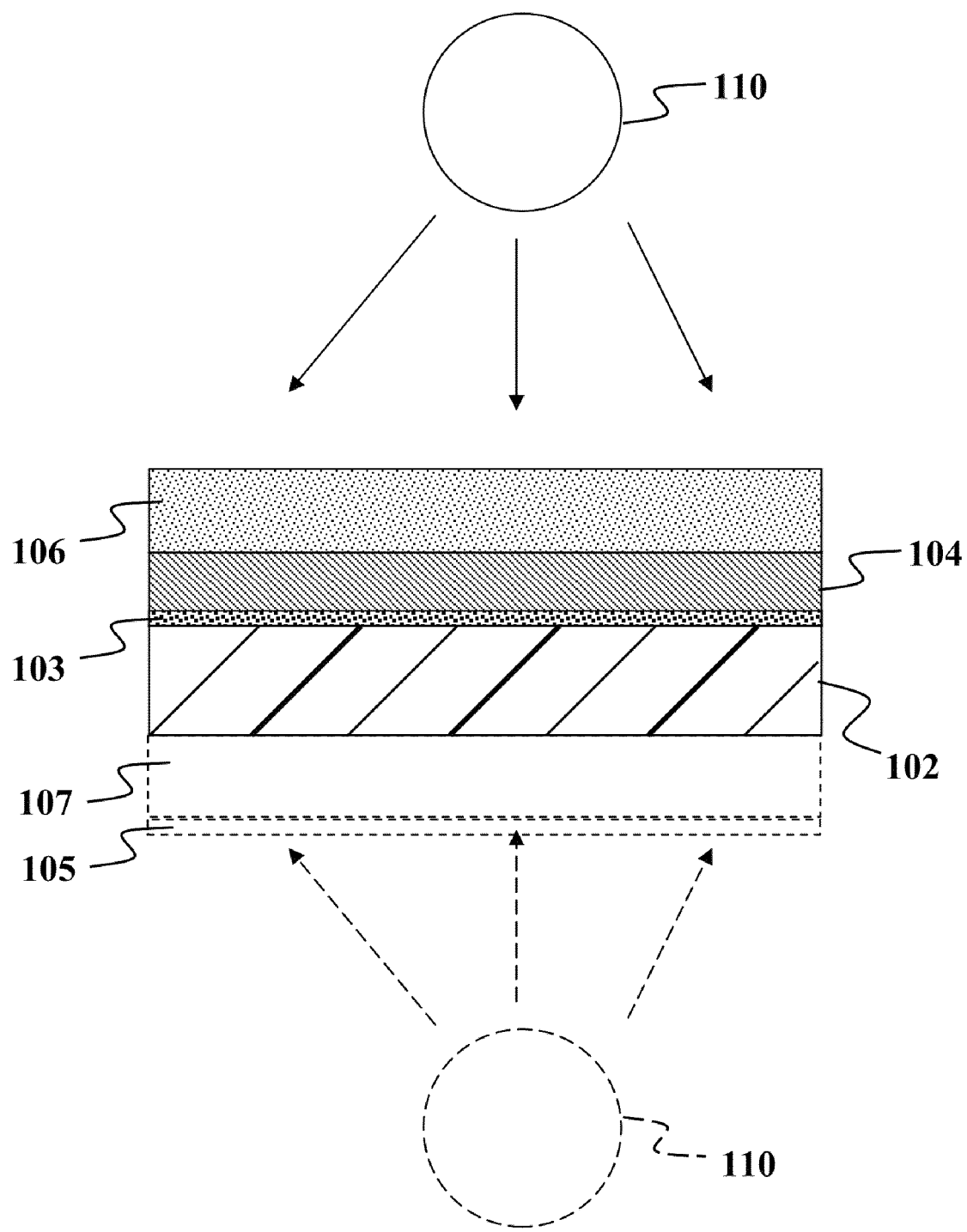
FIG. 5 shows a cross-sectional view of a device according to one embodiment of the present invention.

FIG. 5 depicts a partially fabricated photovoltaic device 100, and a rapid heating unit 110 the device generally includes an aluminum foil substrate 102, an optional base electrode 104, and a nascent absorber layer 106. The aluminum foil substrate 102 may be approximately 5 microns to one hundred or more microns thick and of any suitable width and length. The aluminum foil substrate 102 may be made of aluminum or an aluminum-based alloy. Alternatively, the aluminum foil substrate 102 may be made by metallizing a polymer foil substrate, where the polymer is selected from the group of polyesters, polyethylene naphtalates, polyetherimides, polyethersulfones, polyetheretherketones, polyimides, and/or combinations of the above. By way of example, the substrate 102 may be in the form of a long sheet of aluminum foil suitable for processing in a roll-to-roll system. The base electrode 104 is made of an electrically conducive material compatible with processing of the nascent absorber layer 106. By way of example, the base electrode 104 may be a layer of molybdenum, e.g., about 0.1 to 5 microns thick, and optionally from about 0.1 to 1.0 microns thick. The base electrode layer may be deposited by sputtering or evaporation or, alternatively, by chemical vapor deposition (CVD), atomic layer deposition (ALD), sol-gel coating, electroplating and the like.

Aluminum and molybdenum can and often do inter-diffuse into one another, with deleterious electronic and/or optoelectronic effects on the device 100. To inhibit such inter-diffusion, an intermediate, interfacial layer 103 may be incorporated between the aluminum foil substrate 102 and molybdenum base electrode 104. The interfacial layer may be composed of any of a variety of materials, including but not limited to chromium, vanadium, tungsten, and glass, or compounds such as nitrides (including but not limited to titanium nitride, tantalum nitride, tungsten nitride, hafnium nitride, niobium nitride, zirconium nitride vanadium nitride, silicon nitride, or molybdenum nitride), oxynitrides (including but not limited to oxynitrides of Ti, Ta, V, W, Si, Zr, Nb, Hf, or Mo), oxides, and/or carbides. The material may be selected to be an electrically conductive material. In one embodiment, the materials selected from the aforementioned may be those that are electrically conductive diffusion barriers. The thickness of this layer can range from 10 nm to 50 nm or from 10 nm to 30 nm. Optionally, the thickness may be in the range of about 50 nm to about 1000 nm. Optionally, the thickness may be in the range of about 100 nm to about 750 nm. Optionally, the thickness may be in the range of about 100 nm to about 500 nm. Optionally, the thickness may be in the range of about 110 nm to about 300 nm. In one embodiment, the thickness of the layer 103 is at least 100 nm or more. In another embodiment, the thickness of the layer 103 is at least 150 nm or more. In one embodiment, the thickness of the layer 103 is at least 200 nm or more. Optionally, some embodiments may include another layer such as but not limited to an aluminum layer above the layer 103 and below the base electrode layer 104. This layer may be thicker than the layer 103. Optionally, it may be the same thickness or thinner than the layer 103. This layer 103 may be placed on one or optionally both sides of the aluminum foil (shown as layer 105 in phantom in FIG. 1).

If barrier layers are on both sides of the aluminum foil, it should be understood that the protective layers may be of the same material or they may optionally be different materials from the aforementioned materials. The bottom protective layer 105 may be any of the materials. Optionally, some embodiments may include another layer 107 such as but not limited to an aluminum layer above the layer 105 and below the aluminum foil 102. This layer 107 may be thicker than the layer 103 (or the layer 104). Optionally, it may be the same thickness or thinner than the layer 103 (or the layer 104). Although not limited to the following, this layer 107 may be comprised of one or more of the following: Mo, Cu, Ag, Al, Ta, Ni, Cr, NiCr, or steel. Some embodiments may optionally have more than one layer between the protective layer 105 and the aluminum foil 102. Optionally, the material for the layer 105 may be an electrically insulating material such as but not limited to an oxide, alumina, or similar materials. For any of the embodiments herein, the layer 105 may be used with or without the layer 107.

The nascent absorber layer 106 may include material containing elements of groups IB, IIIA, and (optionally) VIA. Optionally, the absorber layer copper (Cu) is the group IB element, Gallium (Ga) and/or Indium (In) and/or Aluminum may be the group IIIA elements and Selenium (Se) and/or Sulfur (S) as group VIA elements. The group VIA element may be incorporated into the nascent absorber layer 106 when it is initially solution deposited or during subsequent processing to form a final absorber layer from the nascent absorber layer 106. The nascent absorber layer 106 may be about 1000 nm thick when deposited. Subsequent rapid thermal processing and incorporation of group VIA elements may change the morphology of the resulting absorber layer such that it increases in thickness (e.g., to about twice as much as the nascent layer thickness under some circumstances).

The absorber layer may be deposited using various techniques well known in the field. These techniques include evaporation, sputtering, ink deposition, electroplating, two-stage techniques, etc. In electroplating method, first a precursor film including at least copper, indium and gallium may be electroplated. The precursor film may then be reacted at about 400-600.degree. C. in presence of selenium and/or sulfur (which may be included in the precursor film or may be provided from the reaction environment) to form the CIGS absorber layer. The buffer layer is often a sulfide compound such as cadmium sulfide and indium sulfide. The transparent conductive layer may be a transparent conductive oxide (TCO) such as zinc oxide (ZnO), indium tin oxide (ITO), and indium zinc oxide (IZO). The transparent conductive layer may also be a stacked layer of the TCOs listed above.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, it should be understood that materials other than copper, nickel, or material may be used to reflow to fill valleys in the top surface of the substrate material. Any of the materials for use in the interfacial layer or above may be formed by non-vacuum deposition methods including those disclosed herein. For example, the substrate herein can be used with flexible II-VI compound semiconductor solar cells, i.e. Group IIBVIA thin film solar cells such as CdTe solar cells and Group IBIIIAVIA thin film solar cells such as CIGS(S) type solar cells. Some embodiments may include an insulating or high resistivity buffer film (with resistivity value of at least 1000 ohm-cm) formed on the metal substrate. A defect free continuous back contact layer can be formed over the protective film. The buffer layer may be a discontinuous layer which partially exposes surface of the underlying metallic substrate so that when the contact layer (ohmic contact layer) is formed on the buffer layer, the contact layer becomes electrically and physically connected to the underlying substrate. For example, spin-on-glass may be used as the insulating material layer which may be deposited by techniques such as spinning, rolling, dipping, doctor blading, spraying, roll coating or the like. It should be understood that the back surface of the substrate 10 naturally has a greater surface roughness or profile than the smoothed side. The back surface may have an average surface roughness of more than about 200 nm, preferably more than 500 nm, and most preferably more than 1000 nm. The back surface with such rough topography provides an increased surface area for bonding of a conductive lead or a packaging material. Optionally, the metal substrate on the back side have an Ra in the range of about 0.2 to about 0.5 microns. In this example, Rz may be in the range of about 3 to about 7 microns. The substrate herein is not limited and can be carbon steel, stainless steel, steel, aluminum, copper, titanium, their alloys, or other metal substrates.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a size range of about 1 nm to about 200 nm should be interpreted to include not only the explicitly recited limits of about 1 nm and about 200 nm, but also to include individual sizes such as 2 nm, 3 nm, 4 nm, and sub-ranges such as 10 nm to 50 nm, 20 nm to 100 nm, etc. . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited. For example, U.S. patent application Ser. No. 12/17,045 filed Apr. 21, 2008 is fully incorporated herein by reference for all purposes.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A substrate smoothening method comprising:
   providing a metal substrate with a front surface having substantially flat surface portions and protruded surface portions;
   rough finishing the metal substrate to have an Ra in the range of about 0.2 to about 0.5 microns;

removing the some of the protruded surface portions by etching the some of the protruded surface portions to form exposed substrate sections of the metal substrate, wherein the metal substrate has a hardness that prevents smoothening to a desired finish;

flowing a second material into depressed surface portions of the substrate to build up a new top surface having a roughness of about 0.05 microns or smoother;

depositing a contact layer on the second material.

2. The method of claim 1 wherein the contact layer comprises one of tungsten, tantalum, molybdenum, titanium, chromium, ruthenium, iridium and osmium.

3. The method of claim 2 further comprising forming a Group IBIIIAVIA absorber layer over the contact layer.

4. The method of claim 3, wherein the step of forming the Group IBIIIAVIA absorber layer comprises: forming a precursor layer by electrodepositing the precursor layer comprising copper, indium and gallium; and reacting the precursor layer in presence of at least one of selenium and sulfur at a temperature range of 400 to 600° C.

5. The method of claim 3 further comprising forming a transparent layer over the Group IBIIIAVIA absorber layer, and forming a terminal including busbars and conductive fingers over the transparent layer, wherein the transparent layer includes a buffer layer including one of cadmium sulfide and indium sulfide deposited over the Group IBIIIAVIA layer and a transparent conductive layer including one of zinc oxide, indium tin oxide, and indium zinc oxide deposited over the buffer layer.

6. The method of claim 1, further comprising forming a protective film on the substrate, wherein the conductive protective film comprises one of ruthenium, osmium and iridium.

7. The method of claim 6, wherein surfaces of the exposed substrate sections and a top surface of the conductive protective film are substantially coplanar.

8. The method of claim 1, wherein the step of forming the protective film on the substrate comprises sputter depositing ruthenium.

9. The method of claim 1, wherein the selective etching is performed during an electropolishing process to planarize the some of the protruded surface portions.

10. The method of claim 1, wherein the selective etching is performed using an etchant comprising hydrochloric acid.

* * * * *